(12) United States Patent
Kim et al.

(10) Patent No.: US 8,853,098 B2
(45) Date of Patent: Oct. 7, 2014

(54) SUBSTRATE SUPPORT WITH GAS INTRODUCTION OPENINGS

(75) Inventors: Sam H. Kim, San Ramon, CA (US); John M. White, Hayward, CA (US); Soo Young Choi, Fremont, CA (US); Carl A. Sorensen, Morgan Hill, CA (US); Robin L. Tiner, Santa Cruz, CA (US); Beom Soo Park, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 446 days.

(21) Appl. No.: 13/401,755

(22) Filed: Feb. 21, 2012

(65) Prior Publication Data

US 2012/0149194 A1    Jun. 14, 2012

Related U.S. Application Data

(63) Continuation of application No. 12/686,483, filed on Jan. 16, 2009, now abandoned.

(60) Provisional application No. 61/145,361, filed on Jan. 16, 2009.

(51) Int. Cl.
| | | |
|---|---|---|
| H01L 21/00 | (2006.01) | |
| H01L 21/44 | (2006.01) | |
| H01L 21/31 | (2006.01) | |
| H01L 21/469 | (2006.01) | |
| H01L 21/687 | (2006.01) | |
| H01L 21/683 | (2006.01) | |

(52) U.S. Cl.
CPC ...... *H01L 21/68742* (2013.01); *H01L 21/6831* (2013.01)
USPC ............. 438/765; 438/61; 438/680; 438/795; 257/E21.09; 257/E21.158; 257/E21.17

(58) Field of Classification Search
CPC ........................ H01L 21/0228; H01L 21/0262
See application file for complete search history.

(56) References Cited

U.S. PATENT DOCUMENTS

| | | | |
|---|---|---|---|
| 5,380,566 A | 1/1995 | Robertson et al. | |
| 6,296,712 B1 | 10/2001 | Guo et al. | |

(Continued)

FOREIGN PATENT DOCUMENTS

| | | |
|---|---|---|
| JP | 07-171480 A | 7/1995 |
| JP | 2000299288 A | 10/2000 |

(Continued)

OTHER PUBLICATIONS

Official Letter from Japan Patent Office for corresponding Japan Patent Application No. 2011-546321 dated Dec. 24, 2013.

(Continued)

*Primary Examiner* — Mohsen Ahmadi
(74) *Attorney, Agent, or Firm* — Patterson & Sheridan, LLP

(57) ABSTRACT

Embodiments disclosed herein generally relate to an apparatus and a method for placing a substrate substantially flush against a substrate support in a processing chamber. When a large area substrate is placed onto a substrate support, the substrate may not be perfectly flush against the substrate support due to gas pockets that may be present between the substrate and the substrate support. The gas pockets can lead to uneven deposition on the substrate. Therefore, pulling the gas from between the substrate and the support may pull the substrate substantially flush against the support. During deposition, an electrostatic charge can build up and cause the substrate to stick to the substrate support. By introducing a gas between the substrate and the substrate support, the electrostatic forces may be overcome so that the substrate can be separated from the susceptor with less or no plasma support which takes extra time and gas.

19 Claims, 4 Drawing Sheets

(56) References Cited

U.S. PATENT DOCUMENTS

| | | |
|---|---|---|
| 6,432,208 B1 | 8/2002 | Kawakami et al. |
| 6,676,761 B2 | 1/2004 | Shang et al. |
| 7,160,392 B2 | 1/2007 | Shang et al. |
| 7,429,410 B2 | 9/2008 | Keller et al. |
| 7,435,454 B2 | 10/2008 | Brcka |
| 2005/0224181 A1* | 10/2005 | Merry et al. ............. 156/345.35 |
| 2006/0005770 A1 | 1/2006 | Tiner et al. |
| 2006/0219179 A1* | 10/2006 | Sundar .......................... 118/729 |
| 2008/0210680 A1 | 9/2008 | Hayashi et al. |
| 2009/0081827 A1* | 3/2009 | Yang et al. ................... 438/104 |

FOREIGN PATENT DOCUMENTS

| | | |
|---|---|---|
| JP | 2001001224 A | 1/2001 |
| JP | 2002-004048 A | 1/2002 |
| JP | 2002246450 A | 8/2002 |
| JP | 2003068836 A | 3/2003 |
| JP | 2004214312 A | 7/2004 |
| JP | 2005085881 A | 3/2005 |
| JP | 2007081212 A | 3/2007 |
| KR | 10-0721504 A | 2/2003 |
| KR | 2004-0005356 A | 1/2004 |
| KR | 2007-0080362 A | 8/2007 |

OTHER PUBLICATIONS

International search report and written opinion for PCT/US2010/020979 dated Aug. 13, 2010.

English translation of JP 7-171480 A.

* cited by examiner

SUBSTRATE SUPPORT WITH GAS INTRODUCTION OPENINGS

CROSS-REFERENCE TO RELATED APPLICATIONS

This application is a continuation of U.S. patent application Ser. No. 12/686,483 (APPM/14002), filed Jan. 13, 2010, now abandoned which claims benefit of United States Provisional Patent Application Ser. No. 61/145,361 (APPM/14002L), filed Jan. 16, 2009, both of which are herein incorporated by reference.

BACKGROUND OF THE INVENTION

1. Field of the Invention

Embodiments disclosed herein generally relate to an apparatus and a method for placing a substrate substantially flush against a substrate support in a processing chamber.

2. Description of the Related Art

As the demand for larger flat panel displays (FPDs) and larger solar panels continues to grow, so does the size of the substrates used in forming the FPDs and solar panels. With an increase in substrate size, the chambers used to process the substrate increase as well. It is not uncommon for chambers to be sized to process a substrate having a surface area of greater than about two square meters.

Deposition processes such as plasma enhanced chemical vapor deposition (PECVD), physical vapor deposition (PVD), atomic layer deposition (ALD), and chemical vapor deposition (CVD) may be performed to deposit desired layers onto the large area substrates. Removal processes such as etching, either plasma or liquid, may also be performed on the large area substrates as well.

For semiconductor wafer processing, the wafers may have a diameter of about 200 mm or about 300 mm. It is believed that the next generation of semiconductor wafers will be about 400 mm in diameter. Thus, the surface area for semiconductor wafers is significantly smaller than the surface area for large area substrates.

Scaling up the size of semiconductor wafer processing chambers to the size used to process large area substrates is not simple. Many complications may arise such as maintaining a uniform plasma within the chamber, providing sufficient power to generate a plasma in the chamber, and cleaning the chamber to name only a few. Additionally, semiconductor wafers are generally round substrates while many large area substrates are polygonal or rectangular. Scaling up a round processing chamber to process a large area rectangular or polygonal substrate may not work.

Therefore, there is a need for a processing chamber to process large area substrates.

SUMMARY OF THE INVENTION

Embodiments disclosed herein generally relate to an apparatus and a method for placing a substrate substantially flush against a substrate support in a processing chamber. When a large area substrate is placed onto a substrate support, the substrate may not be perfectly flush against the substrate support due to gas pockets that may be present between the substrate and the substrate support. The gas pockets can lead to uneven deposition on the substrate. Therefore, pulling the gas from between the substrate and the substrate support may pull the substrate substantially flush against the substrate support. During deposition, an electrostatic charge can build up and cause the substrate to stick to the substrate support. By introducing a gas between the substrate and the substrate support, the electrostatic forces may be overcome so that the substrate can be separated from the susceptor with less or no plasma support which takes extra time and gas.

In one embodiment, an apparatus is disclosed. The apparatus may include a substrate support having one or more first holes therethrough having a first diameter, a vacuum pump coupled with the substrate support at a location corresponding to the one or more first holes, and a gas supply coupled with the substrate support at a location corresponding to the one or more first holes.

In another embodiment, a method is disclosed. The method includes inserting a substrate into a processing chamber, positioning the substrate onto one or more lift pins, raising a substrate support from a position spaced from the substrate to a position in contact with the substrate, and evacuating gas from any spaces between the substrate and the substrate support such that the substrate is pulled into a position substantially flush with the substrate support. The evacuating occurs through the substrate support.

In another embodiment, a method includes igniting a plasma within a processing chamber containing a substrate support having a substrate thereon, injecting a gas between the substrate support and the substrate, and lowering the substrate support or raising one or more lift pins to space the substrate from the substrate support.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 10 is a schematic cross sectional view of the apparatus of FIG. 1A where the substrate rests substantially flush against the substrate support.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

The embodiments disclosed herein will be described in reference to a PECVD chamber. A suitable PECVD chamber may be purchased from AKT America, Inc., a subsidiary of Applied Materials, Inc., Santa Clara, Calif. It is to be understood that the embodiments disclosed herein may be practiced in other processing chambers, including those sold by other manufacturers.

Figure 1A:
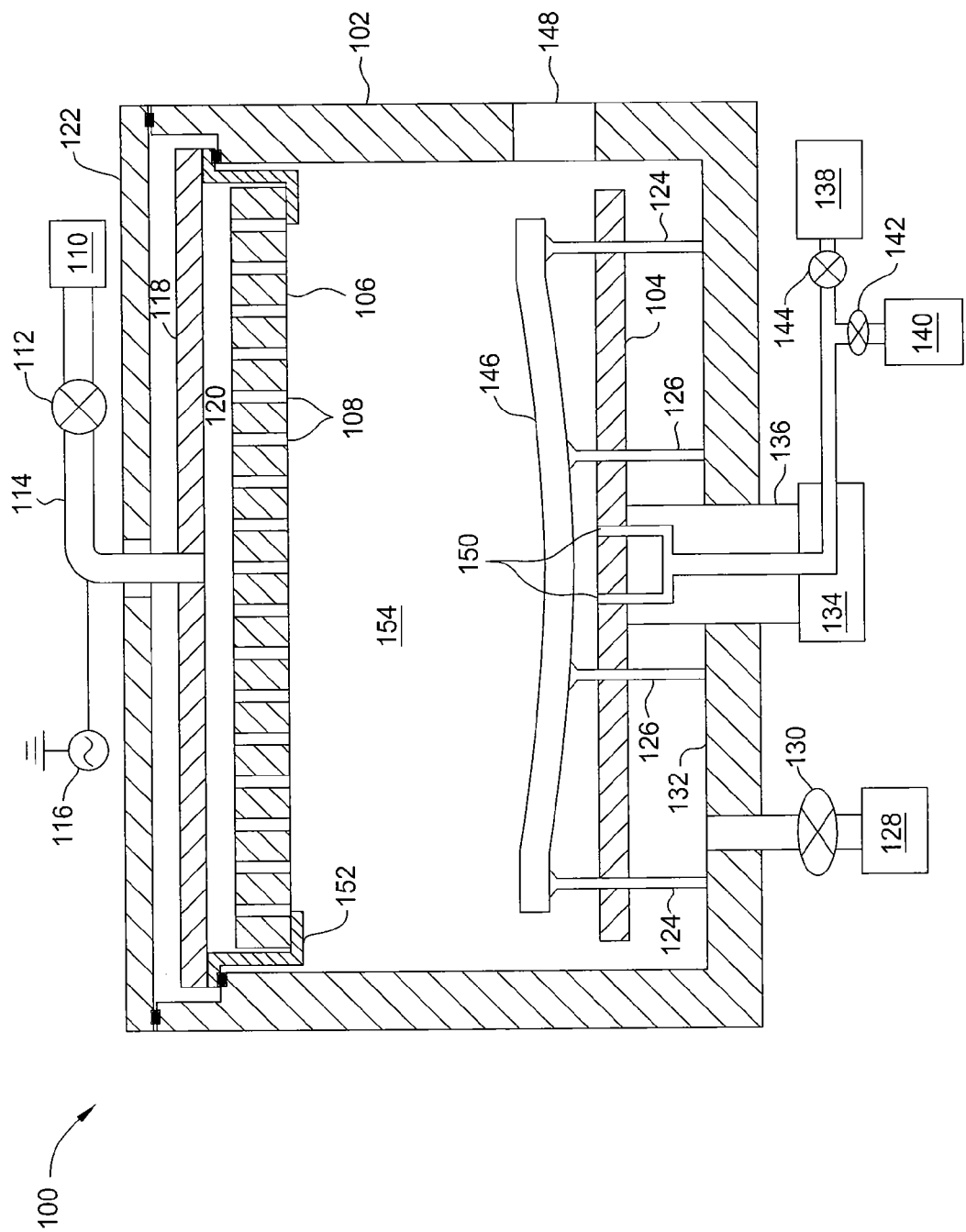
FIG. 1A is a schematic cross sectional view of an apparatus according to one embodiment in which the substrate is raised above the substrate support.

FIG. 1A is a schematic cross sectional view of an apparatus 100 according to one embodiment in which the substrate 146 is raised above the substrate support 104. The substrate 146 is initially brought into the chamber through a slit valve opening 148 that is present in at least one wall 102 of the chamber. The substrate 146 is placed on the lift pins 124, 126 above the substrate support 104.

Opposite to the substrate support 104, a gas distribution showerhead 106 may be present. The showerhead 106 may have a plurality of gas passages 108 extending therethrough. Processing gas and/or cleaning gas may be fed to the chamber from a gas source 110. The amount of processing and/or cleaning gas delivered may be regulated by a valve 112 that is selectively opened and closed. The processing gas travels to the processing chamber through a tube 114 that is coupled to the backing plate 118 such that the gas flows through the backing plate 118 above the showerhead 106 and expands into a plenum 120 between the backing plate 118 and the showerhead 106. The plenum 120 permits the gas to substantially evenly distribute behind the showerhead 106 before passing through the gas passages 108 so that the amount of processing gas that passes through the gas passages 108 near the center is substantially equal to the amount of gas that passes through the gas passages 108 near the edge of the showerhead 106.

A power source 116 may be coupled with the processing chamber. In one embodiment, the power source 116 may comprise an RF power source capable of delivering currents at a frequency between about 10 MHz and about 100 MHz. The power source 116 may be coupled with the tube 114. RF current penetrates only a certain, predeterminable distance into conductive material. The predetermined penetration is sometimes referred to as a 'skin effect'. Due to the 'skin effect' of RF current, the tube 114 may be conductive to permit the RF current to travel along the outside surface while permitting the gas to be flowing through the inside of the tube 114. The gas within the tube 114 does not 'see' the RF current due to the 'skin effect' and thus may not ignite into a plasma within the tube 114.

The RF current travels from the power source 116 to the tube 114. The RF current then travels along the outside surface of the tube 114 down to the backing plate 118. Rather than penetrating through the backing plate 118, the RF current travels along the backside of the backing plate 118 because the backing plate 118 is conductive. The bracket 152 that electrically couples the showerhead 106 to the backing plate 118 is also conductive and thus the RF current travels along the surface of the bracket 152 to the front surface of the showerhead 106. The RF current then ignites the processing gas into a plasma within the processing area 154.

RF current returns to the source driving it. Therefore, the RF current will seek to return to the power source 116. The RF current will travel along the substrate support 104, down the pedestal 136, along the bottom 132 of the chamber, up the chamber walls 102, along the bottom of the lid 122 and back to the power source 116. It is to be understood that RF return path may be shortened by coupling straps between the substrate support 104 and the bottom 132 and/or walls 102.

During processing, the processing gas is delivered to the chamber from the gas source 110, through the tube 114 into the plenum 120 between the backing plate 118 and the showerhead 106. The gas then evenly distributes within the plenum 120 and then passes through the gas passages 108 into the processing area 154. The RF current, which travels from the power source 116 along the tube 114, the back surface of the backing plate 118, the bracket 152, and the front surface of the showerhead 106, ignites the gas into a plasma within the processing area 154. Material is then deposited onto the substrate 146.

Prior to processing, the substrate 146 is initially placed into the processing chamber through the slit valve opening 148 on an end effector. The end effector lowers the substrate 146 and places the substrate 146 on the lift pins 124, 126. The lift pins 124, 126 rest on the bottom 132 of the chamber. The end effector then retracts. The processing chamber may be evacuated by a vacuum pump 128. The level of vacuum may be controlled by a valve 130 that is opened and closed.

Figure 1B:
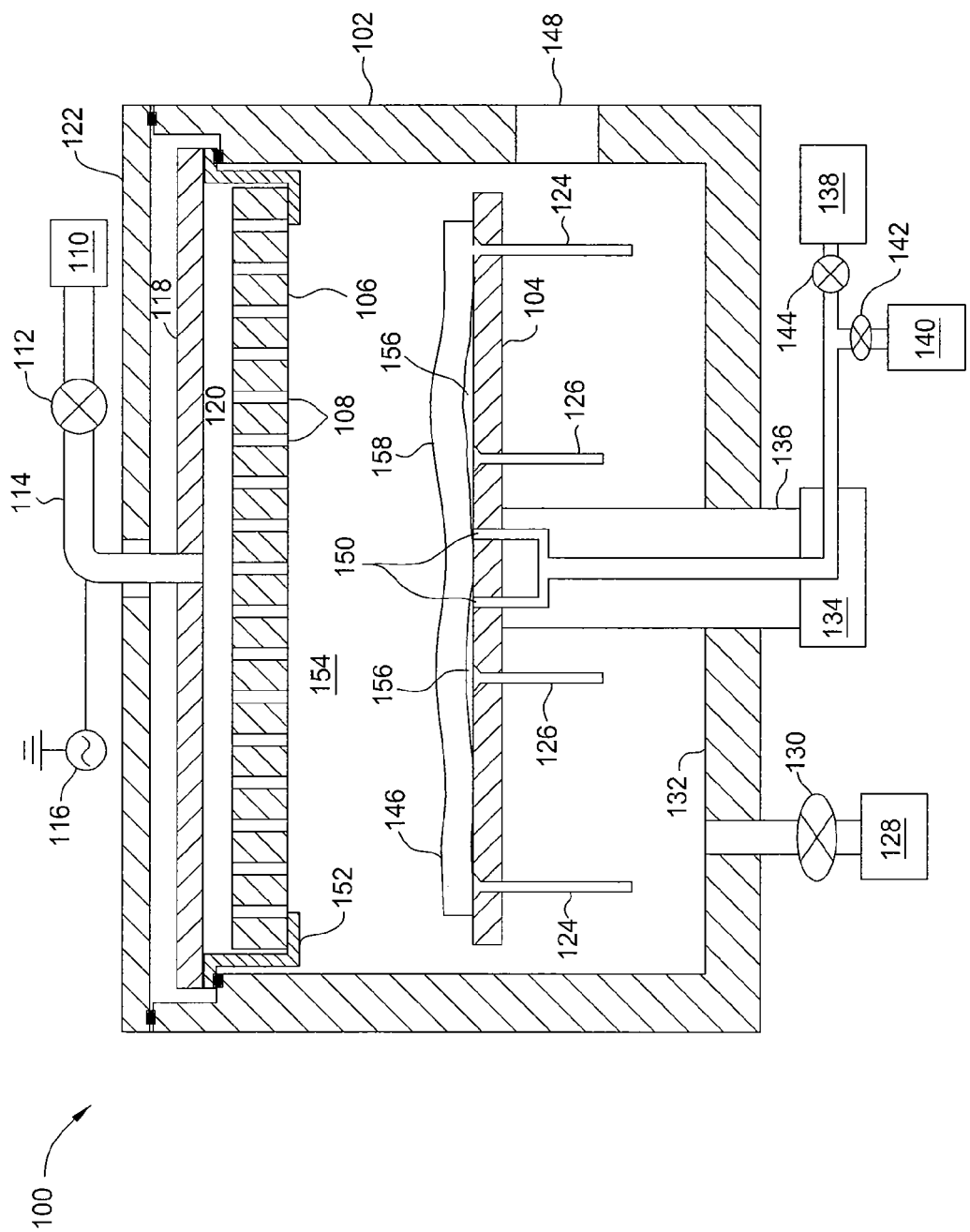
FIG. 1B is a schematic cross sectional view of the apparatus of FIG. 1A where the substrate rests on the substrate support.

After the substrate 146 is placed on the lift pins 124, 126 and the end effector retracts out of the chamber, the substrate support 104 may be raised by an actuator 134 such that the substrate 146 rests on the substrate support 104. FIG. 1B is a schematic cross sectional view of the apparatus of FIG. 1A where the substrate 146 rests on the substrate support 104. When the substrate support 106 has raised to the processing position, the lift pins 124, 126 are lifted off of the bottom 132 of the chamber.

It is to be understood that while description has been made regarding the lift pins 124, 126 resting on the bottom 132 of the chamber and the substrate support 104 moving relative to the lift pins 124, 126, the discussion contained herein is equally applicable to the situation where the lift pins 124, 126 may move independent of the substrate support 104. For example, the substrate support 104 may remain stationary while the lift pins 124, 126 raise and lower to move the substrate 146 from a position spaced from the substrate support 104 to a position in contact with the substrate support 104. Additionally, both the substrate support 104 and the lift pins 124, 126 may move independently such that the lift pins 124, 126 lower while the substrate support 104 raises and vice versa. The center to edge progression discussed herein and the edge to center progression discussed herein would be applicable to each situation.

Because the substrate 146 is so large, in some cases at least two square meters in surface area, the substrate 146 may not rest perfectly flush against the substrate support 104. Thus, gaps 156 may be present between the substrate 146 and the substrate support 104. The gaps 156 may be due to several factors. One factor is the heating of the substrate 146 may cause the substrate 146 to buckle. The substrate 146 may initially be heated upon entry into the chamber. The temperature of the chamber may be greater than the substrate due to the heating of the chamber during a previous process. The plasma in the previous process may heat the chamber to temperatures of about 200 degrees Celsius in some cases. The substrate 146, however, may be placed into the processing chamber after being retrieved from a load lock chamber. The substrate 146 may, just prior to entry into the chamber, be at a temperature lower than the chamber and thus buckle when entering the chamber.

Additionally, the gaps 156 may be present because gas unfortunately gets trapped between the substrate 146 and the substrate support 104 when the substrate support 104 raises to contact the substrate 146. Lift pins 126 are shorter than lift pins 124. Thus, then the substrate support 104 is raised, the substrate 146 contacts the substrate support 104 in the center and generally rolls out to the edge of the substrate 146. In so rolling, gas between the substrate 146 and the substrate support 104 is generally pushed out from between the substrate 146 and the substrate support 104. However, some gas may remain trapped between the substrate 146 and the substrate support 104 to produce gaps 156 therebetween.

The gaps 156 between the substrate 146 and the substrate support 104 lead to an uneven deposition surface 158 on the substrate 146. The uneven deposition surface 158 may lead to uneven deposition thereon including thin spots where not as much deposition occurs. Not wishing to be bound by theory unless explicitly claimed, it is believed that the gaps 156 lead to the thin spots. The thin spots may form on the substrate 146 because the deposited material may tend to deposit in the lower areas and build up. The material would continue to deposit until the desired thickness has been reached. Once the desired thickness has been reached, the top surface of the film is expected to be substantially planar. While the gaps 156 are present, the deposited layer may appear even. However, once the substrate 146 is removed from the chamber and substantially leveled, the material deposited on the substrate 146 would no longer be planar and thin spots would remain.

Another reason that the thin spots may form is due to the plasma density. The RF current that travels from the power source 116 along the tube 114, backing plate 118, bracket 152, and showerhead 106 ignites the processing gas into a plasma. The showerhead 106 is considered RF 'hot' because the RF current is directly applied to the showerhead 106. The substrate support 104, on the other hand, is a part of the RF return path. Some refer to the substrate support 104 as an anode in opposition to the cathode or showerhead 106. Nonetheless, the RF current from the plasma travels along the substrate support 104 and eventually back to the power source 116. The RF current couples to the substrate support 104 through the substrate 106. Because the substrate 146 is not substantially flush against the substrate support 104 due to the gaps 156, the RF current does not couple to the substrate support 104 at the locations corresponding to the gaps 156. Without RF current coupling to the substrate support 104 at the gaps 156, the plasma may be non-uniformly distributed within the chamber. The non-uniform plasma distribution may lead to uneven deposition on the substrate 146.

Figure 1C:
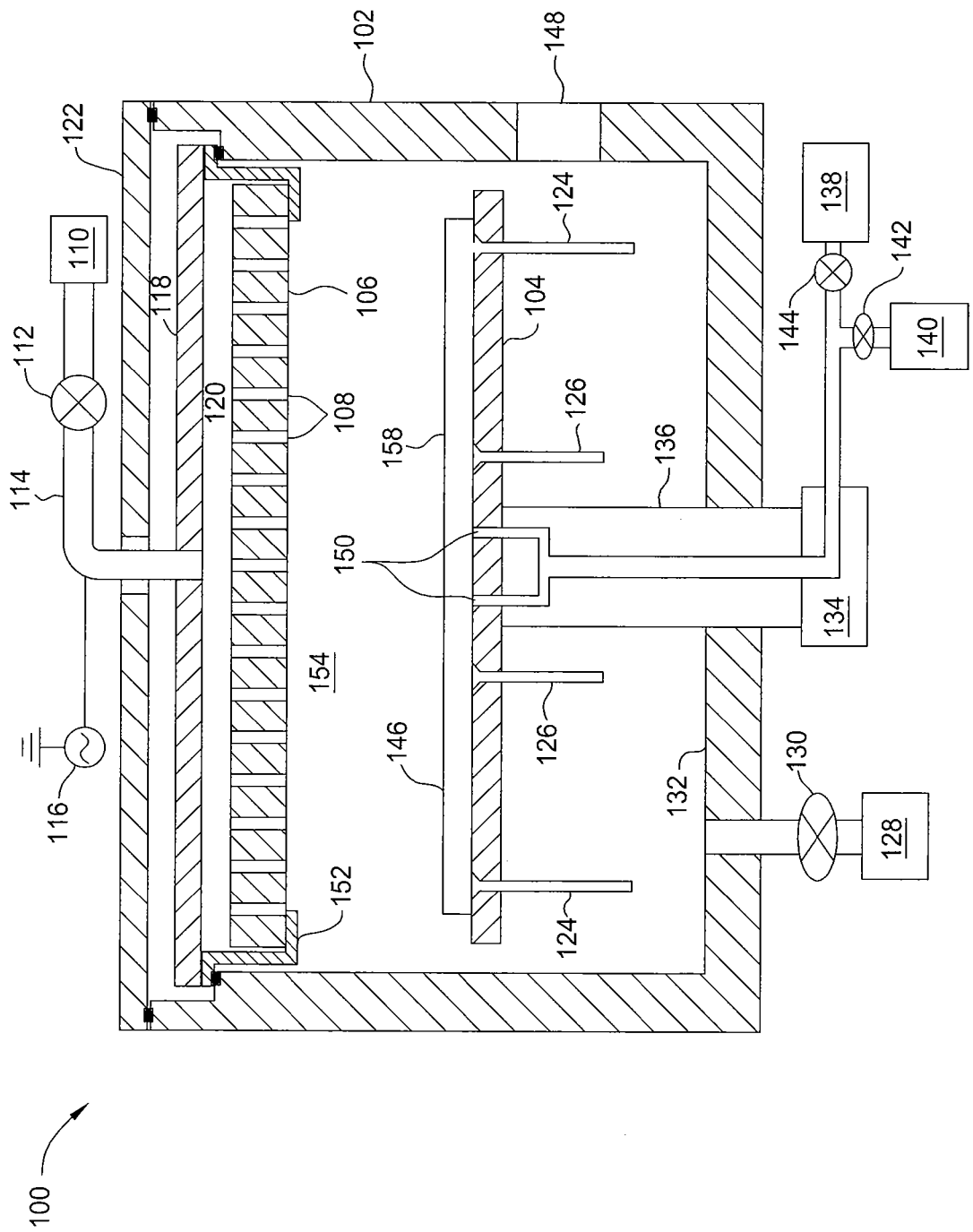

To combat the uneven plasma distribution, it would be beneficial for the substrate 146 to be substantially flush against the substrate support 104. When the substrate 146 is substantially flush against the substrate support 104, substantially no gaps 156 should be present and the RF current can couple to the substrate support 104 through the substrate 146 at substantially the entire bottom surface of the substrate 146. FIG. 1C is a schematic cross sectional view of the apparatus of FIG. 1A where the substrate 146 rests substantially flush against the substrate support 104. In order to pull the substrate 146 substantially flush against the substrate support 104, the gas that is trapped between the substrate 146 and substrate support 104 is removed so that the gaps 156 are removed.

As discussed above, the substrate 146 is initially placed on the lift pins 124, 126 by an end effector. The end effector then retracts out of the chamber. The substrate support 104 then raises to meet the substrate 146. The substrate 146 comes into contact with the substrate support 104 in a center to edge progression until the substrate 146 is supported by the substrate support 104 and not the lift pins 124, 126. Similar to the substrate 146, the lift pins 124, 126 are supported by the substrate support 104. Any gas remaining trapped between the substrate 146 and the substrate support 104 may be removed by evacuating the gas from the gaps 156 and thereby pull the substrate 146 substantially flush against the substrate support 104. The gaps 156 may be evacuated by a vacuum pump 140 that is coupled to the substrate support 104. One or more openings 150 through the substrate support 104 permit the gas to be pulled through the substrate support 104 and out of the chamber through the vacuum pump 140. A valve 142 may be opened and closed as necessary to control the vacuum pull from the vacuum pump 140.

In addition to pulling any gas trapped in the gaps 156, the substrate 146 may be plasma loaded or pre-plasma loaded. Plasma loading is a process for thermophoresis that is used to heat the substrate 146 to a temperature greater than its surroundings. Because the substrate 146 is heated to a temperature greater than its surroundings, any negatively charged particles or other contaminants tend to gravitate towards the coolest surface. When a substrate 146 is introduced into a processing chamber, the substrate 146 may be the coolest surface and thus, risk contamination. By heating the substrate 146 to a temperature greater than the surroundings, the negatively charged particles may gravitate to a surface other than the substrate 146. Plasma loading, which is different from pre-plasma loading, involves rapidly raising the temperature of the substrate 146.

A plasma loading sequence involves inserting a substrate 146 into a processing chamber and placing the substrate 146 onto the substrate support 104. No plasma is ignited prior to placing the substrate 146 onto the substrate support 104. Then, the pressure of the chamber is increased above the normal processing pressure. An inert gas such as a noble gas or a gas that does not chemically react with the substrate 146 is introduced into the chamber and ignited into a plasma. The plasma heats the substrate up to a temperature that is greater than the other electrode (a showerhead 106 in a PECVD system). Then, the plasma is extinguished, the gas evacuated, and the pressure reduced to normal. The substrate 146 may then be processed. Alternatively, plasma loading may comprise igniting a plasma while the substrate support 104 is moving upwards to make contact with the substrate 146. The gaps 156 may be evacuated in addition to the plasma loading.

Pre-plasma loading, on the other hand, is a process to help bring the substrate 146 into contact with the substrate support 104. For pre-plasma loading, a substrate 146 is supported by an end effector as it is brought into a processing chamber. The end effector is then lowered to place the substrate 146 on the lift pins 124, 126 that extend from the bottom 132 of the chamber through the substrate support 104. Once the substrate 146 is resting on the lift pins 124, 126, the end effector is retracted from the chamber.

While the substrate 146 is resting on the lift pins 124, 126 and before the substrate 146 rests on the substrate support 104, a gas may be introduced into the chamber. The gas may comprise a gas that does not chemically react with the substrate 146 or cause any deposition onto the substrate 146. Examples of gases that may be used include hydrogen, nitrogen, ammonia, argon, and combinations thereof. The gas is then ignited into a plasma.

Similar to the situation that occurs during plasma deposition, an electrostatic charge develops on the substrate 146 and/or the substrate support 104. The power applied to ignite the plasma may be discontinued and the chamber may then be pumped down to the base pressure for processing. The substrate support 104 may then be raised and the substrate 146 may contact the substrate support 104 in a center to edge manner at a slow speed. The substrate support 104 is raised without any gas or plasma until the substrate 146 is supported by the substrate support 104. It is only after the plasma is extinguished that the substrate support 104 is raised.

The electrostatic charge that has built up on the substrate 146 and/or the substrate support 104 may pull the substrate 146 into greater contact with the substrate support 104 such that the amount of gaps 156 that may be present between the substrate 146 and the substrate support 104 may be reduced below what would be present in absence of the pre-plasma loading process.

Any gases that remain trapped in the gaps 156 may then be evacuated by the vacuum pump 140 through the openings 150 to pull the substrate 146 substantially flush against the substrate support 104. Once the substrate 146 is supported by the substrate support 104, processing gases may be introduced into the chamber and ignited into a plasma by RF power. The substrate 146 may thus be processed.

Once processing has been completed, the substrate 146 may be power lifted from the substrate support 104. To power lift the substrate 146 from the substrate support 104, a gas may be introduced into the chamber. The gas may be a gas that does not chemically react with the processed substrate 146. If a gas that chemically reacts with the substrate 146 were used, then undesirable processing of the substrate 146 may occur. Therefore, the gas should be chemically inert relative to the processed substrate 146. In one embodiment, the gas may be selected from hydrogen, nitrogen, argon, and ammonia.

The gas that has been introduced is ignited into a plasma. In one embodiment, the RF power used to ignite the plasma is lower than the RF power applied to generate the plasma used to deposited material onto the substrate 146. The processed substrate 146 is exposed to the plasma for a predetermined time period. In one embodiment, the time period is between about 5 seconds and about 15 seconds. Not wishing to be bound by theory, it is believed that the plasma of non-reactive gas removes, reduces or redistributes the electrostatic charge built up on the substrate 146 and substrate support 104 such that the substrate 146 may be removed from contact with the substrate support 104 without damaging the substrate 146. The removal, reduction or redistribution of the electrostatic charge reduces the stiction between the substrate 146 and the substrate support 104 and thus allows the substrate 146 to be more easily separated from the substrate support 104. By using a power lower than used for the depositing of material, the charge applied to the substrate 146 and the substrate support 104 during the power lifting is limited.

To separate the substrate 146 from the substrate support 104 after the power lifting, the substrate support 104 is lowered and the substrate 146 is supported by the lift pins 124, 126. The substrate 146 separates from the substrate support 104 in an edge to center progression. The substrate 146 may, however, still stick to the substrate support 104 in areas away from the edge of the substrate 146. If the substrate 146 sticks to the substrate support 104, the substrate 146 may break or be damaged. To additionally overcome the stiction, gas may be introduced between the substrate 146 and the substrate support 104.

The gas may be introduced to form gaps 156 between the substrate 146 and the substrate support 104. The gaps 156 may reduce stiction between the substrate 146 and the substrate support 104 to aid in removing the substrate 146 from the substrate support 104. The gas may be introduced by opening a valve 144 and permitting gas to be introduced between the substrate 146 and the substrate support 104 through the openings 150 from a gas source 138. The gas from the gas source 138 may comprise a gas that does not chemically react with the substrate 146 or cause any deposition onto the substrate 146. Examples of gases that may be used include hydrogen, nitrogen, ammonia, argon, and combinations thereof. Introducing gas between the substrate 146 and the substrate support 104 may be performed in addition to the power lifting. The gas may be introduced to form the gaps 156 prior to the power lifting, concurrent with the power lifting, or after the power lifting.

Figure 2:
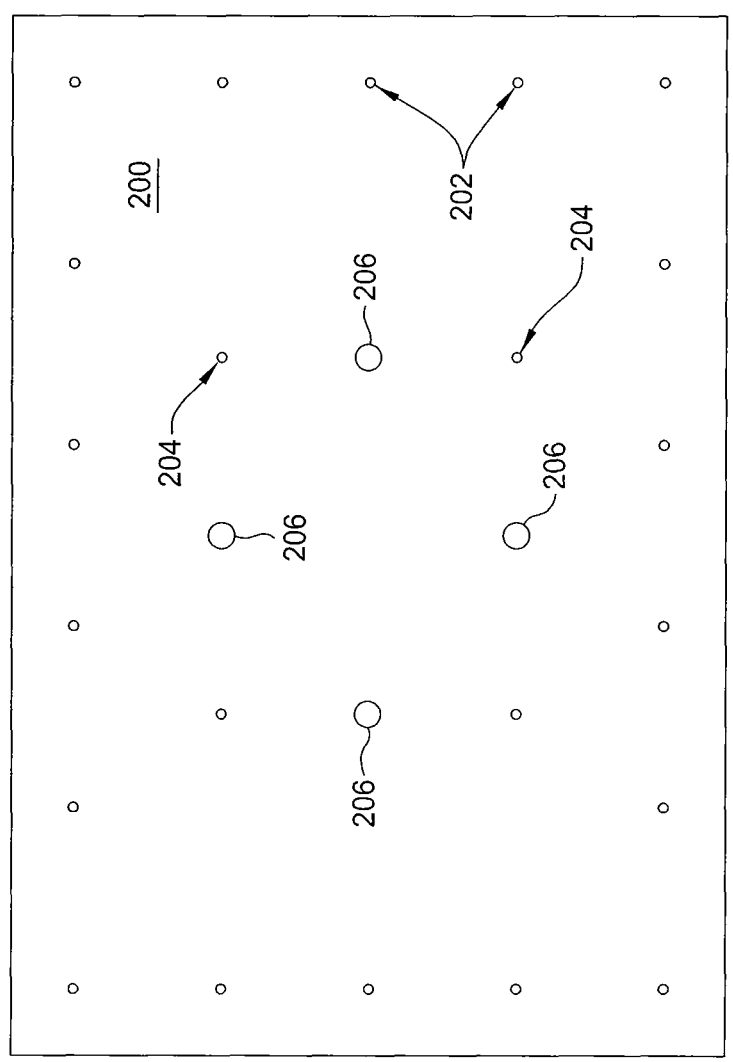
FIG. 2 is a schematic top view of a substrate support according to one embodiment.

FIG. 2 is a schematic top view of a substrate support 200 according to one embodiment. The substrate support has openings 202 for outer lift pins and openings 204 for inner lift pins. The openings 202, 204 have substantially the same diameter. Openings 206 are also present for introducing or withdrawing gas through the substrate support 200. It is to be understood that while four openings 206 have been shown, more or less openings 206 may be present. Additionally, while the openings 206 have been shown disposed near the openings 204, the openings 206 may be at other locations in addition to, or alternative to the locations shown in FIG. 2. The diameters of the openings 206 are shown to be greater than the diameters of the openings 202, 204, but it is to be understood that the openings 206 may have the same diameter or a smaller diameter than the openings 202, 204.

There are numerous advantages to the embodiments discussed herein. By withdrawing gas from between a substrate and a substrate support, a substrate may be brought into intimate contact with the substrate support such that the substrate is substantially flush against the substrate support. With the substrate substantially flush against the substrate support, material may deposit uniformly on the substrate. By introducing gas between the substrate and the substrate support, stiction forces that hold the substrate in intimate contact with the substrate support may be overcome so that the substrate may be more easily removed from contact with the substrate support. Thus, uniformity issues and breakage issues for large area substrates may be overcome.

While the foregoing is directed to embodiments of the present invention, other and further embodiments of the invention may be devised without departing from the basic scope thereof, and the scope thereof is determined by the claims that follow.

The invention claims is:

1. A method for processing a substrate, sequentially comprising:
    positioning a substrate onto a substrate support, wherein a first gas is present between the substrate and a supporting surface of the substrate support;
    operating a pump to evacuate the first gas through the supporting surface, such that the substrate is pulled into a position substantially flush with the supporting surface;
    injecting a second gas into the processing chamber;
    igniting the second gas into a plasma within the processing chamber; and
    injecting a third gas through the supporting surface to separate at least a portion of the substrate from the supporting surface.

2. The method of claim 1, further comprising causing relative movement between the supporting surface and the one or more lift pins, at least after delivery of the third gas begins, such that the entire substrate is spaced from the substrate support.

3. The method of claim 2, wherein the substrate is separated from the supporting surface in an edge to center progression during the relative movement between the substrate and the one or more lift pins.

4. The method of claim 1, wherein the positioning comprises causing relative movement between the substrate support and the lift pins, to position the substrate in contact with the supporting surface.

5. The method of claim 4, wherein the substrate rests on the one or more lift pins and a center of the substrate sags towards the supporting surface.

6. The method of claim 1, wherein the third gas is chemically inert relative to the processed substrate.

7. The method of claim 1, wherein the third gas is a noble gas.

8. The method of claim 1, wherein the third gas comprises hydrogen, nitrogen, ammonia, or argon.

9. The method of claim 1, further comprising causing relative movement between the supporting surface and the one or more lift pins, concurrent with the introduction of the third gas.

10. A method for processing a substrate, sequentially comprising:

positioning the substrate onto one or more lift pins in a processing chamber;

moving a substrate support relative to the one or more lift pins such that the substrate is positioned on a supporting surface of the substrate support, wherein a first gas remains between the substrate and the supporting surface;

operating a pump to vacuum hold the substrate to the supporting surface such that the substrate is pulled into a position substantially flush with the supporting surface;

injecting a second gas into the processing chamber;

igniting the second gas into a plasma within the processing chamber;

extinguishing the plasma; and injecting a third gas through one or more openings formed in the supporting surface to separate at least a portion of the substrate from the supporting surface.

11. The method of claim 10, wherein the third gas is a noble gas.

12. The method of claim 11, wherein the substrate rests on the one or more lift pins such that a center of the substrate sags towards the supporting surface support during the positioning.

13. The method of claim 12, wherein the substrate contacts the supporting surface in a center to edge progression during the moving.

14. The method of claim 10, wherein the substrate contacts the supporting surface in a center to edge progression during the moving.

15. The method of claim 10, wherein one or more of the lift pins move independent of the substrate support.

16. The method of claim 10, further comprising moving the substrate support relative to the one or more lift pins after the third gas is injected.

17. The method of claim 16, wherein the third gas comprises hydrogen, nitrogen, ammonia, or argon.

18. The method of claim 1, wherein the one or more openings are dispersed to proportionally cover a supporting surface of the substrate support.

19. The method of claim 10, wherein the one or more openings are dispersed to proportionally cover a supporting surface of the substrate support.

* * * * *

UNITED STATES PATENT AND TRADEMARK OFFICE
CERTIFICATE OF CORRECTION

PATENT NO.       : 8,853,098 B2                                               Page 1 of 1
APPLICATION NO.  : 13/401755
DATED            : October 7, 2014
INVENTOR(S)      : Kim et al.

It is certified that error appears in the above-identified patent and that said Letters Patent is hereby corrected as shown below:

In Claims:

Column 8, Claim 4, Line 54, please delete "the" after wherein;

Column 10, Claim 12, Line 5, please delete "support".

Signed and Sealed this
Fourth Day of August, 2015

Michelle K. Lee
*Director of the United States Patent and Trademark Office*